United States Patent

McCarthy et al.

[11] 4,174,531
[45] Nov. 13, 1979

[54] PRINTED CIRCUIT BOARD WITH INCREASED ARC TRACK RESISTANCE

[75] Inventors: Donald C. McCarthy, Delran; Martin Rayl, Lawrenceville, both of N.J.

[73] Assignee: RCA Corporation, New York, N.Y.

[21] Appl. No.: 851,401

[22] Filed: Nov. 14, 1977

[51] Int. Cl.² ............................................. H05K 1/04
[52] U.S. Cl. ................................. 361/411; 174/52 PE
[58] Field of Search ..................... 361/411; 174/52 PE

[56] References Cited

U.S. PATENT DOCUMENTS

| 3,628,999 | 12/1971 | Schneble, Jr. | 361/411 |
| 4,051,550 | 9/1977 | Seno et al. | 361/411 |

OTHER PUBLICATIONS

Quayle et al., "Experimental Encapsulation Technique", *Electronic Design*, Jan. 1955, pp. 46–47.
Halpern, "Modern Insulation Concepts", *RCA Engineer*, vol. 5, No. 1, Jun.-Jul. 1959, pp. 8–10.
Ernst et al., "Potting with Vinyl", *Electronic Design*, May 27, 1959, pp. 28, 30, 31.

*Primary Examiner*—David Smith, Jr.
*Attorney, Agent, or Firm*—Birgit E. Morris

[57] ABSTRACT

This invention pertains to increasing the arc track resistance of printed circuit boards by applying an acrylic resin to the printed circuit board wherein the acrylic resin is a polymer having the recurring unit:

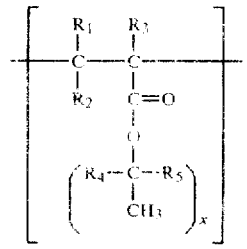

wherein x of each unit is independently selected from integers of 0 to 15 and each $R_1$, $R_2$, $R_3$, $R_4$ and $R_5$ is independently selected from the group consisting of H, —$CH_3$ and —$C_2H_5$.

11 Claims, 1 Drawing Figure

U.S. Patent  Nov. 13, 1979  4,174,531
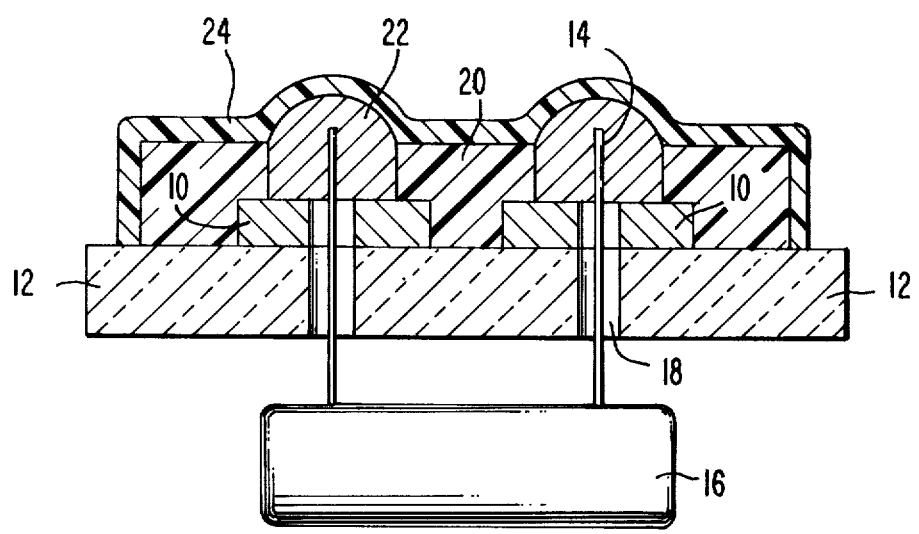

PRINTED CIRCUIT BOARD WITH INCREASED ARC TRACK RESISTANCE

BACKGROUND OF THE INVENTION

Printed circuit boards comprising an electrically insulative substrate and a conductive network are susceptible to arc tracking when employed in electrical devices. Arc tracking is a process whereby carbon tracks are produced between the electrodes on the surface of the circuit board due to the action of electrical discharge. The tracks are randomly oriented, but their density increases as the discharge process continues. When a continuous carbon track has been established between the electrodes, the surface conductivity may be high enough to draw current and cause electrical failure or in rare instances, ignition. It has thus been desired to provide printed circuit boards with increased resistance to arc tracking. A printed circuit board with increased arc track resistance must, however, be easily and economically manufactured and solderable without damage to the printed circuit board.

SUMMARY OF THE INVENTION

This invention pertains to increasing the arc track resistance of a printed circuit board having an electrically insulative substrate and a conductive network bonded to said substrate. The conductive network in the substrate is coated with an acrylic resin wherein the acrylic resin is a polymer having the recurring unit:

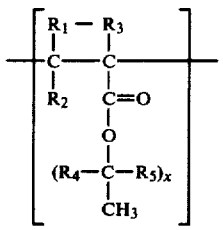

wherein x of each unit is independently selected from integers of 0 to 15 and each $R_1$, $R_2$, $R_3$, $R_4$ and $R_5$ is independently selected from the group consisting of H, —$CH_3$ and —$C_2H_5$. It has been found that when the above coating is applied to the printed circuit board, the arc track resistance is greatly increased. The coating can be easily and economically applied and, when required, the board can be resoldered and a repair coating of acrylic can be reapplied.

BRIEF DESCRIPTION OF THE DRAWING

The FIGURE is a schematic illustrating a side cross-sectional view of a printed circuit board coated with an acrylic resin of the present invention.

DETAILED DESCRIPTION OF THE INVENTION

Conductive networks on electrically insulative substrates are suitably prepared by one of two methods. In one method a conductive network is chemically etched into a conductive layer laminated on an electrically insulative substrate. Suitable laminated boards are types FR-2, FR-3, FR-4 and XXXPC available from the General Electric Company of Coshocton, Ohio and the NVF Co. of Kennett Square, Pa. The boards are copper layers laminated on insulative materials such as paper phenolics and epoxy glass. Prior to etching, either a positive or negative photoresist layer is applied to the laminated layer. A suitable positive photoresist is Riston, a trademarked product available from the Dupont Company of Wilmington, Del. Using standard lithographic techniques, a network pattern is delineated into the photoresist layer which exposes portions of the conductive layer. A suitable etchant solution, such as aqueous ferric chloride is used to remove the exposed portions of the conductive layer forming a conductive network from the unexposed portion of the conductive layer. The remaining photoresist may be removed by contacting with an organic solvent such as trichloroethylene.

In a second method for forming a printed circuit board an insulative substrate not having conductive laminated layers is coated with a photoresist layer. Employing standard lithographic techniques a network pattern is also be delineated in the photoresist layer exposing areas of the insulative substrate. A conductive material such as copper is then plated onto the substrate by electroless deposition forming the conductive network. A suitable electroless solution is type Cu 400 available from the Ethone Company of West Haven, Conn. The remaining photoresist is removed with a solvent leaving a copper network on the insulative substrate.

Holes may be formed in the printed circuit board, such as by punching, for attaching electrical components to the conductive network. The components are attached to the board by inserting electrical leads from the components into the holes and soldering the leads to the conductive network. In commercial applications the soldering is accomplished by mounting the printed circuit boards on conveyor belts. The areas of the printed circuit board which are not to be soldered are coated with a solder resist material such as epoxy polyester amide. The printed circuit board is then conveyed to a molten bath of solder. A wave of solder is created in the molten solder bath which contacts the printed circuit board. The molten solder adheres only to the printed circuit board not covered with solder resist material. After the board is coated with solder the printed circuit board is removed from the solder bath and the solder is allowed to cool and harden.

According to the present invention, an acrylic resin is applied to the prepared printed circuit board. The acrylic resin is a polymer having the formula given above.

A suitable acrylic resin is a copolymer of methyl methacrylate and butyl methacrylate having the recurring units:

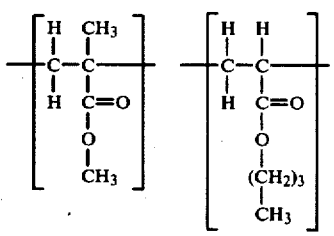

Suitably the acrylic resin has a glass transition temperature (Tg) of about 30° C. to about 80° C. and preferably about 35° C. to about 50° C. Resins with Tg's above about 80° C. have been found to be too brittle and resins with Tg's below about 35° C. too tacky for printed circuit board applications.

The acrylic resins may be applied by such conventional techniques as brush coating, dipping, spraying and wave coating. In one embodiment of this invention the methyl methacrylate butyl, methacrylate copolymer is applied as an emulsion. Suitably the emulsion contains about 30% to 35% solids and the copolymer has an average molecular weight greater than about a 1,000,000 and a glass transition temperature of about 40° C. A suitable emulsion is type A-601 available from Polyvinyl Chemical Industries of Wilmington, Mass. The coating is applied by dipping the printed circuit board into the emulsion. After the printed circuit board has been removed from the emulsion the coating is allowed to harden by drying such as by air drying for approximately 15 minutes and/or incandescent baking for about 30 seconds. Acrylic layers about 10 to about 25 micrometers thick are formed.

The FIGURE is a schematic illustration of a cross sectional view of an embodiment of a printed circuit board. A conductive metal network layer 10 is laminated on an electrically insulative substrate 12. Electrical leads 14 of electrical components 16 are inserted into holes 18. Solder resist layers 20 are coated onto the substrate 12 and the conductive network 10. The solder resist layer 20 may be coated only on the side of the printed circuit board having the conductive network 20 as shown or may be additionally applied to the side of the board having the electrical component 16. It has been found that solder resist material on the electrical component 16's side of the board side also aids in increasing the arc track resistance of the board. Solder layers 22 affix the electrical leads 18 to the conductive network 10. The outer layer 24 is an acrylic resin of the present invention. The acrylic layer 24 has been found to increase the arc track resistance of the printed circuit board.

The arc track resistance of the coated printed circuit boards of the present invention or other materials can be determined by the following method. The material to be tested is applied to an insulative substrate. Two chisel-shaped platinum electrodes 5 millimeters wide are mounted 4 millimeters apart on the material to be tested with a force of 100 gms. A fixed voltage of low ac stress is applied to the electrodes in the range of about 100 to 1000 volts. An ionic contaminate in the form of an electrolyte solution is applied between the electrodes by dropping one drop every 30 seconds onto the test material. A suitable electrolyte solution is 0.1% by weight of NH$_4$Cl in distilled water. A failure occurs when one ampere of current is drawn between the electrodes. The voltage at which failure occurs after 50 drops is referred to as the "comparative tracking index" voltage or CTI voltage. It has been desired to have printed circuit boards with CTI's greater than 800 volts and preferably greater than 900 volts.

It has been determined that phenolic paper boards have CTI's of about 920 volts before processing. The CTI of the phenolic paper board, however, decreases to about 125 to 225 volts after any printed board processing has occurred, such as applying the conductive network layers to the phenolic substrate, or soldering the printed circuit board. It has been found that applying a layer of acrylic resin of the present invention to the processed printed circuit board increases the arc track resistance of the coated processed circuit board to a CTI of over 900 volts. It has also been found that repairing coated printed circuit boards of the present invention by resoldering the boards does not lower the arc track resistance.

The following Examples are presented to further describe the invention but it is not meant to limit the invention to the details described therein.

EXAMPLE 1

A pattern leaving two strips 4 millimeters apart was lithographically delineated into a photoresist layer of Riston which had previously been coated onto a laminated copper layer of a type FR-2 paper phenolic board. Using an aqueous solution of ferric chloride the pattern was etched from the copper layer forming two copper strips under the photoresist layer. The residual photoresist was removed with trichloroethylene.

A layer of solder resist material of an epoxy polyester amide was coated on portions of the phenolic board and the copper network which was not to be coated with solder. The solder resist layer was about 15 micrometers thick. The surface of the phenolic board with the copper network and solder resist material was dipped into a molten bath of solder and removed. Upon cooling, hardened solder formed on the uncoated copper network.

The board was then coated with a methyl methacrylate-butyl methacrylate copolymer by dipping the board into a type A-601 emulsion described previously and then air drying for 15 minutes. The dried acrylic layer was about 35 microns thick. Platinum electrodes were positioned on the copper strips and a CTI of about 1000 volts was measured using the procedure described previously.

EXAMPLE 2

Two copper strips 4 millimeters apart were formed by etching a laminated copper layer on a type FR-2 board as described in Example 1. The etched board without solder or a solder resist layer was coated with a methyl methacrylate-butyl methacrylate copolymer by dipping the board into a type A-601 emulsion. A CTI of about 1000 volts was measured.

CONTROL A

This Example is presented as a control. The etched board as described in Example 2 was prepared but without an acrylic coating. The CTI was measured at 125 volts.

CONTROLS B-E

In these Controls boards were prepared as in Example 2 but were coated with materials other than the acrylics of the present invention.

Control B was coated with NCO RF-2 U-912, a trademarked clear aliphatic urethane available from the Polyvinyl Chemical Industries Company of Wilmington, Mass. The CTI was measured at 520 volts.

Control C was coated with a poly(vinyl acetatevinylchloride) copolymer. The CTI was determined to be 525 volts.

Control D was prepared by coating with a cellulose acetate butyrate compound. The CTI was measured at 715 volts.

Control E was coated with an epoxy compound. The CTI was determined to be about 250 volts.

What is claimed is:

1. A printed circuit board consisting essentially of:
   (a) an electrically insulative substrate;

(b) a conductive network layer bonded to the substrate;
(c) a solder resist material adhered to selected areas of the network layer and the substrate;
(d) solder bonded to selected areas of the network layer;
(e) components affixed by means of electrical leads to the conductive layers by the solder; and
(f) an acrylic resin coated over the substrate, network layer, solder and solder resist material wherein the acrylic resin is a polymer having the recurring unit of the formula:

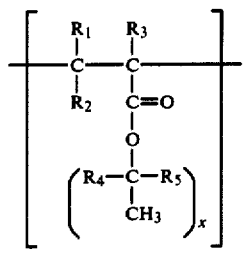

wherein x of each unit is independently selected from integers of 0 to 15 and each $R_1$, $R_2$, $R_3$, $R_4$ and $R_5$ is independently selected from the group consisting of H, —$CH_3$ and —$C_2H_5$ and whereby the acrylic resin coating increases the arc track resistance of an electrical potential applied to the circuit board.

2. A printed circuit board according to claim 1 wherein the electrically insulative substrate is a phenolic paper board.

3. A printed circuit board according to claim 1 wherein the conductive network layer is a copper layer.

4. A printed circuit board according to claim 1 wherein the solder resist material is an epoxy polyester amide.

5. A printed circuit board according to claim 1 wherein the acrylic resin is a copolymer of methyl methacrylate butyl methacrylate.

6. A printed circuit board according to claim 4 wherein the copolymer has a molecular weight greater than about 1,000,000.

7. A printed circuit board according to claim 1 wherein the acrylic resin has a glass transition temperature of about 30° C. to about 80° C.

8. A printed circuit board according to claim 1 wherein the acrylic resin has a glass transition temperature of about 35° C. to about 50° C.

9. A method of increasing the arc track resistance of a printed circuit board having an electrically insulative substrate and a conductive network bonded to said substrate which comprises coating the conductive network and the substrate with an acrylic resin which is a polymer having recurring units of the formula:

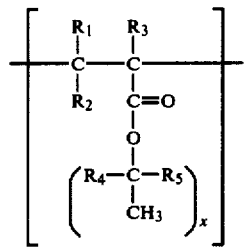

wherein x of each unit is independently selected from integers of 0 to 15 and each $R_1$, $R_2$, $R_3$, $R_4$ and $R_5$ is independently selected from the group consisting of H, —$CH_3$ and —$C_2H_5$.

10. A method according to claim 9 which further comprises forming holes in the substrate inserting electrical leads from components into the holes, applying solder resist material to the conductive network and substrate, and soldering the electrical leads to the conductive network wherein the acyrlic resin coats the solder resist material and solder.

11. A method according to claim 9 wherein the acrylic resin is a copolymer of methyl methacrylate and butyl methacrylate.

* * * * *